United States Patent [19]

Akasaki et al.

[11] Patent Number: 5,217,922
[45] Date of Patent: Jun. 8, 1993

[54] METHOD FOR FORMING A SILICIDE LAYER AND BARRIER LAYER ON A SEMICONDUCTOR DEVICE REAR SURFACE

[75] Inventors: Hiroshi Akasaki, Akishima; Kanji Otsuka, Higashiyamato; Tetsuya Hayashida, Nishitama, all of Japan

[73] Assignees: Hitachi, Ltd.; Hitachi VLSI Engineering Corp., both of Tokyo, Japan

[21] Appl. No.: 810,313

[22] Filed: Dec. 19, 1991

[30] Foreign Application Priority Data

Jan. 31, 1991 [JP] Japan .................. 3-10586

[51] Int. Cl.⁵ .................. H01L 21/52; H01L 21/58; H01L 21/60
[52] U.S. Cl. .................. 437/183; 437/215; 29/840; 29/843; 228/180.2; 228/254
[58] Field of Search .......... 437/183, 215, 218, 247, 437/902; 228/123, 180.2, 254; 29/840, 843, 874

[56] References Cited

FOREIGN PATENT DOCUMENTS 56-148836 11/1981 Japan .
62-249429 10/1987 Japan .
63-175450 7/1988 Japan .
63-310139 12/1988 Japan .

OTHER PUBLICATIONS

"Micro-solder Bonding Technology for ICs and LSIs", by Ryohei Satoh, et al; Japan Metal Society Proc., vol. 23, No. 12 (1984).

Primary Examiner—Olik Chaudhuri
Assistant Examiner—David E. Graybill
Attorney, Agent, or Firm—Pennie & Edmonds

[57] ABSTRACT

A method of manufacturing a semiconductor device wherein the back surface of a semiconductor chip is adhered closely to a substrate or a seal member through a soldering material or the like, and a metallized layer is formed on the back surface of the chip for attaining good adhesion. The metallized layer according to the present invention is a layer formed by laminating a metal silicide, a barrier metal and an oxidation preventing metal successively on the back of the chip. The layer of the metal silicide can be formed in a known heat treatment process, for example, simultaneously with the formation of bump electrodes, on a main surface of the semiconductor chip by the heat used at the time of forming such bump electrodes, or simultaneously with the mounting of the semiconductor chip by the heat used at the time of the chip mounting.

16 Claims, 5 Drawing Sheets

FIG. 4(A)
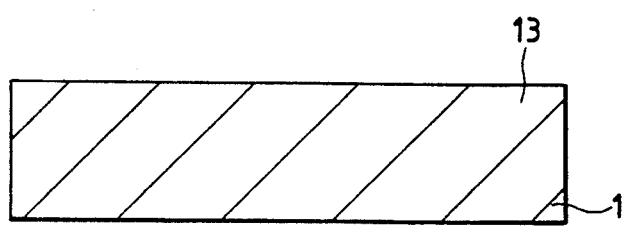
FIG. 4(B)
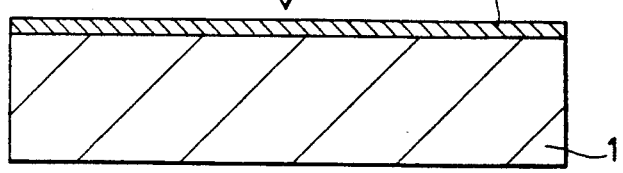
FIG. 4(C)
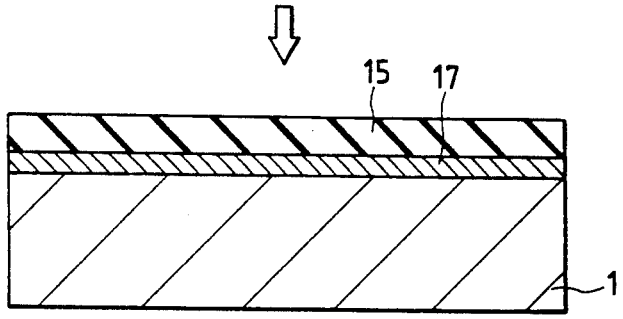
FIG. 4(D)
FIG. 4(E)
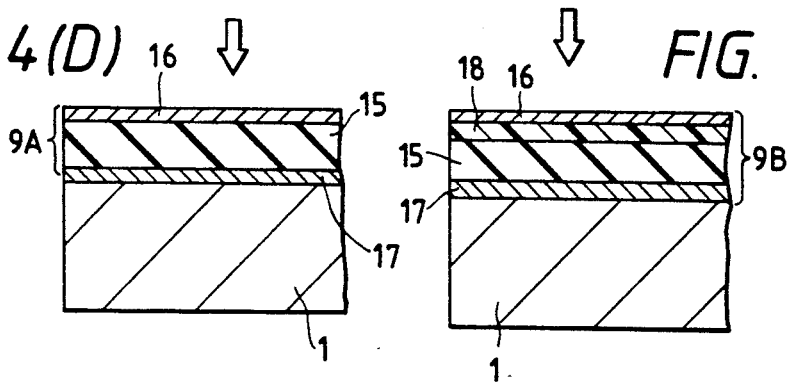

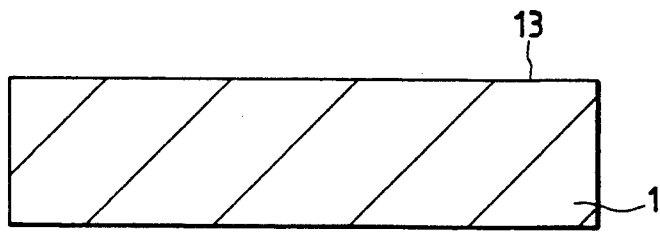
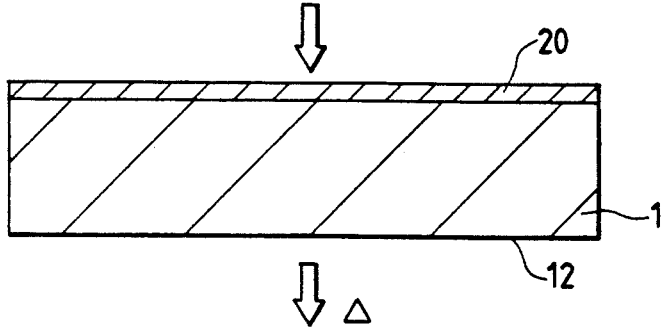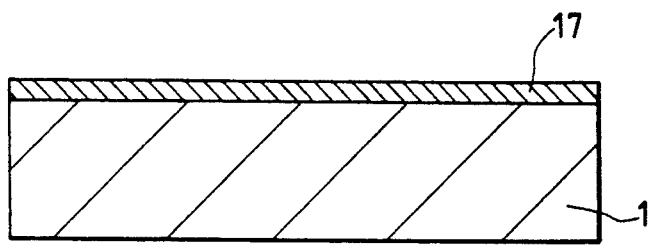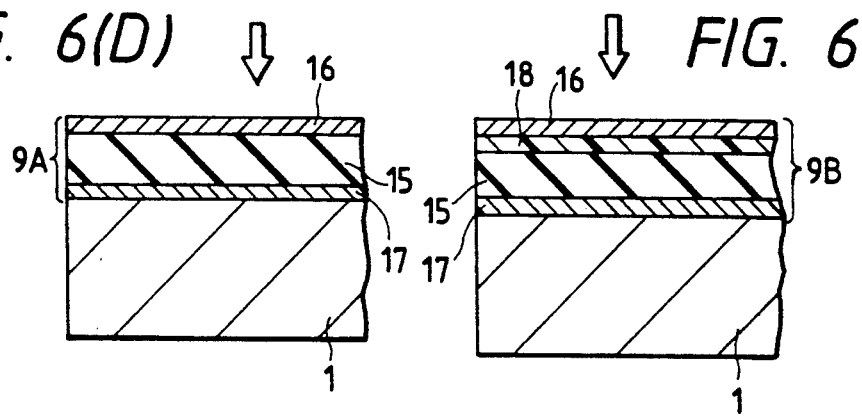

METHOD FOR FORMING A SILICIDE LAYER AND BARRIER LAYER ON A SEMICONDUCTOR DEVICE REAR SURFACE

BACKGROUND OF THE INVENTION

The present invention relates to a semiconductor device, particularly to a technique effective in the application to metallization for the bonding of a semiconductor device of a structure wherein the back surface of a semiconductor element is fixed using a soldering material or the like, and also effective in the application to a method for manufacturing such a semiconductor device.

As a semiconductor device of the type wherein the back surface of a semiconductor element is fixed, there is known a chip carrier of a structure wherein a semiconductor chip is face-down-bonded directly to a circuit board through CCB (Controlled Collapse Bonding) bump electrodes formed on a main surface of the chip and then a cap is applied to the back surface of the chip in a closely contacted state to provide a seal.

In such a chip carrier, as described, for example, in Japanese Patent Laid-Open No. 310139/1988, a heat transfer portion is formed and a hermetic seal is made thereby between the back surface of the semiconductor chip and the cap, using a soldering material, e.g. solder, for radiating heat directly from the back surface of the chip. On the back surface of the semiconductor chip, there is formed a metallized layer by plating an Au film, a Cr film, a Cu film and an Au film successively from the chip back surface in order, to improve the wettability for solder.

The chip carrier is assembled using the flip chip bonding technique described in Japan Metal Society Proc. Vol. 23, No. 12 (1984), pp. 1004–1006. First, thin Cr/Cu/Au film electrodes (i.e. BLM layer) are formed on aluminum electrodes of a silicon wafer with a semiconductor integrated circuit formed thereon using a vapor evaporation technique, a fine processing technique, etc. Next, a metallized layer comprising Au/Cr/Cu/Au films is formed on the back of the Si wafer. Further, solder is fed onto the BLM layer and heat-melted in a nitrogen atmosphere (a wet back process) to form solder bumps, then the wafer is cut into individual chips. Thereafter, onto a circuit board with electrodes, etc. formed thereon there is bonded each semiconductor chip by face down bonding, that is, in such a manner that the circuit-formed main surface of the chip is opposed to the circuit board, followed by heat-melting (a mounting and reflow process) Subsequently, solder is fed to a back of the semiconductor chip and also to a sealing portion of the circuit board, and a cap is put on the back of the chip in a closely contacted state, followed by heat-melting, whereby the chip is hermetically sealed in the interior

SUMMARY OF THE INVENTION

It has been found out by the present inventor that there arise the following problems in the case of using Au/Cr/Cu/Au films in the formation of the metallized layer on the back surface of a semiconductor chip as in the prior art referred to above.

In the formation of bump electrodes and in the flip chip mounting process, it is necessary to provide a heat treatment process at a high temperature (about 350° C.) for the reflow of solder. As a result:

(I) Cu is apt to be diffused into an Au film, and if the Au film is thin, Cu will be diffused throughout the surface of the Au film to form an oxide film. Since the adhesion of this oxide film to solder is poor, there is not obtained a stable adhesion between the back of the semiconductor chip and the cap, thus resulting in deterioration of the heat radiation efficiency.

(II) If the Au film is made thicker to avoid the above problem (I), Sn contained in the solder and the residual Au without contribution to preventing the Cu diffusion will react together to form an Au-Sn alloy layer. Due to the formation of this alloy layer, Sn which should react with Cu is trapped, so that the wettability of the solder is deteriorated. Further, since this alloy layer is hard, a heat stress concentration causes brittle fracture of the alloy layer more easily.

(III) Thickening the Au film is expensive.

In view of the above problems, metallization using Cr or Ti as the first layer may be effective in omitting the sintering process. However, since the film of Cr or Ti is poor in its adhesion in a low temperature process, there arises the problem that exfoliation is apt to occur.

It is an object of the present invention to provide a metallization structure capable of affording good adhesion to the back of a silicon substrate without thermal damage to a BLM layer or a semiconductor element, and excellent in soldability.

It is another object of the present invention to provide a semiconductor device which is inexpensive and high in reliability.

It is a further object of the present invention to provide a technique capable of preventing a thermal deterioration of a metallized layer and improving the wettability for solder.

The above and other objects and novel features of the present invention will become apparent from the following description and the accompanying drawings.

The following are brief summaries of typical inventions out of those disclosed herein.

(1) In a semiconductor device of a structure wherein the back surface of a semiconductor substrate such as a semiconductor chip formed by a single crystal silicon is fixed with an adhesive such as a soldering material, a metallized layer comprising a metal silicide difficult to be diffused in Au, a barrier metal and Au is formed in the bonding portion of the back surface of the semiconductor substrate.

More specifically, the semiconductor device comprises a first substrate formed of silicon and having a main surface on which are formed circuits and plural electrodes and also having a back surface on an opposite side; a second substrate bonded closely to the back surface through an adhesive layer; and a metallic layer formed between the back of the first substrate and the adhesive layer, the metallic layer being comprised of a metal silicide, a barrier metal and an oxidation preventing metal which are arranged successively from the side contacted with the first substrate.

(2) In a semiconductor device wherein a circuit substrate with a semiconductor chip mounted thereon is hermetically sealed with a cap so as to be in close contact with the back of the chip, a chip carrier wherein a metallized layer comprising a metal silicide, a barrier metal and an oxidation preventing metal is formed on the back surface of the chip, and an adhesive layer is interposed between the chip and the cap.

More specifically, the semiconductor device comprises a semiconductor chip made of silicon and having a main surface on which are formed circuits and plural electrodes and also having a back surface on an opposite side; bump electrodes formed on the electrodes; a substrate for mounting the semiconductor chip through the bump electrodes; means for hermetically sealing the semiconductor chip; mean for adhering the back of the semiconductor chip and the sealing means in close contact with each other; and a metallic layer formed between the back surface of the semiconductor chip and the adhering means, the metallic layer being comprised of a metal silicide, a barrier metal and an oxidation preventing metal which are arranged successively from the back surface of the semiconductor chip.

(3) A method for manufacturing a semiconductor chip, comprising a process of forming a electrode base metal layer on a main surface of a semiconductor substrate made of a single crystal silicon; a process of metallizing the back of the semiconductor substrate to form a metallized layer comprising a metal silicide, a barrier metal and Au; and a process of feeding solder onto the electrode base metal layer followed by wet back to form electrodes on the substrate main surface, the metal silicide layer being formed simultaneously with the wet back process.

More specifically, a method for manufacturing a semiconductor device, comprising:

(a) providing a first substrate made of silicon and having a main surface on which are formed circuits and plural electrodes and also having a back surface on an opposite side;

(b) forming a first metallic layer comprising a barrier metal and an oxidation preventing metal on the back surface of the first substrate;

(c) simultaneously forming bump electrodes on the electrodes and a second metallic layer of a metal silicide between the back surface of the first substrate and the barrier metal; and (d) fixing a second substrate into close contact with the back of the first substrate through an adhesive layer.

(4) A method for manufacturing a semiconductor device, comprising a process of placing the main surface electrode side of the semiconductor chip fabricated in the above (3) onto a semiconductor chip mounting substrate and a process of feeding solder onto the foregoing metallized layer and sealing with a cap for close contact with the same layer, the metal silicide layer being formed simultaneously with the heat treatment in the mounting of the semiconductor chip onto the mounting substrate.

More specifically, a method for manufacturing a semiconductor devices comprising:

(a) providing a semiconductor chip of silicon having a main surface on which are formed circuits and plural bump electrodes and also having a back surface on an opposite side on which is formed a first metallic layer comprising at least two kinds of metals;

(b) mounting the semiconductor chip onto a substrate having plural electrodes on the main surface thereof so that the electrodes are electrically connected with the bump electrodes and at the same time forming a second metallic layer of a metal silicide between the back surface of the semiconductor chip and the first metallic layer; and (c) hermetically sealing the semiconductor chip by sealing means through an adhesive layer formed on the back of the chip.

By constituting the metallized layer on the back of a semiconductor substrate of silicon, using a metal silicide, a barrier metal and Au successively from the substrate side, and by forming the metal silicide layer in accordance with a heat history of a known heat treatment process, it is possible to prevent the deterioration caused by thermal damage of the characteristics of a BLM film, a semiconductor element, etc. and improve the solderability of the back of the semiconductor substrate.

BRIEF DESCRIPTION OF THE DRAWINGS

FIGS. 4(A) to 4(E) are sectional views of main processes, showing other methods for fabricating the metallization structures of the embodiments I and II;

FIGS. 6(A) to 6(E) are sectional views of main processes, showing fabrication methods for the metallization structures of the embodiments I and II, using as the barrier metal a metal which forms a silicide at a high temperature.

DESCRIPTION OF PREFERRED EMBODIMENTS

The present invention will be described hereinunder in terms of embodiments thereof.

[Embodiment I]

Figure 1:
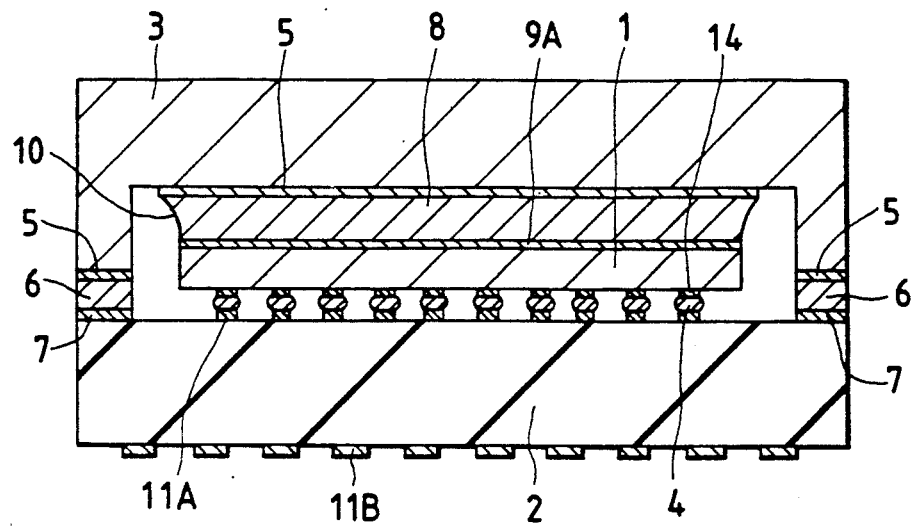
FIG. 1 is a sectional view of a semiconductor device using a metallization structure according to an embodiment I of the present invention.

FIG. 1 illustrates a semiconductor device (chip carrier) using a metallization structure embodying the present invention, in which a semiconductor substrate (semiconductor chip) 1 is mounted in a face down manner onto a chip mounting surface of a mounting substrate 2 and then sealed hermetically with a sealing cap 3 through an adhering member 6.

The mounting substrate 2 of the semiconductor device is formed of, for example, mullite (a sintered $Al_2O_3 \cdot SiO_2$ mixture) and has a multilayer wiring structure (not shown). Plural electrodes 11A are disposed on the chip mounting surface of the mounting substrate 2, while on the back thereof are disposed a plurality of electrodes 11B. The electrodes 11A and 11B are connected together electrically through lines of the above multilayer wiring structure and also through terminal resistors.

The semiconductor chip 1 is formed of, for example, a single crystal silicon substrate and logical circuits, etc. are formed on its element forming surface 12 (the surface on which bump electrodes 4 are formed in FIG. 1). A plurality of external terminals are arranged on the element forming the surface side of the semiconductor chip 1, and a base metal film (under bump metal layer) 14 for ensuring the wettability of the bump electrodes 14 is formed on each of the external terminals.

The bump electrodes 4, which are formed of Sn-Pb solder (melting point: about 320°-330° C.) containing about 1–4 wt % of Sn for example, are interposed between the electrodes 11A of the mounting substrate 2 and the base metal film 14 of the semiconductor chip 1.

The sealing cap 3, which is U-shaped in cross section, hermetically seals the semiconductor chip 1 in cooperation with the mounting base 2. The cap 3 is formed of a material superior in thermal conductivity and having a thermal expansion coefficient almost equal to that of the semiconductor chip 1, e.g., AlN (aluminum nitride).

The inner cavity side of the sealing cap 3 is connected through a heat conducting layer 10 to a back surface 13 on the side opposite to the element forming surface 12 of the semiconductor chip 1. The heat conducting layer 10 can transmit heat which is generated by the operation of each logical circuit mounted on the chip 1, to the sealing cap 3 in high efficiency. The heat conducting layer 10 is formed by a solder material lower in melting point than the bump electrodes 4, e.g., Sn-Pb solder (melting point: about 300°–310° C.) containing about 10 wt % of Sn or Pb-Ag solder containing about 2.5 wt % of Ag. Between the sealing cap 3 and the heat conducting layer 10 is formed a metallized layer 5 of Ti/Ni/Au, for example. On the back surfaces of the heat conducting layer 10 and the semiconductor chip 1, there is formed a metallized layer 9A of Ni-Si/Ni/Au for example.

The sealing cap 3 is bonded to the mounting substrate 2 using the adhering material 6 around the semiconductor chip 1. Between the cap 3 and the adhering member 6 is formed a metallized layer 5 of Ti/Ni/Au for example. Further, between the mounting substrate 2 and the adhering member 6 is formed a metallized layer 7 of W/Ni/Au for example.

How to form the metallized layer 9A which is a metallization structure according to the present invention will be described below with reference to FIGS. 2(A) to (F).

Figure 2A:
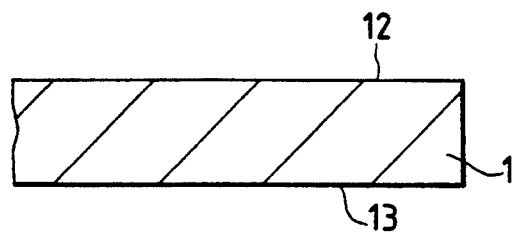
FIGS. 2(A) to 2(F) are sectional views of main processes, showing how to fabricate the semiconductor device illustrated in FIG. 1.
Figure 2B:
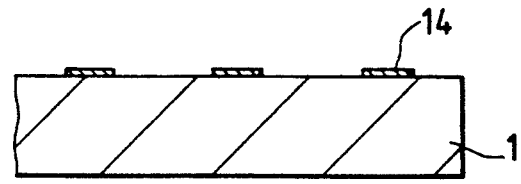

In FIG. 2(A), first the back of the semiconductor substrate 1 is ground mechanically so as to give a desired thickness of the substrate 1 which is in the form of a wafer and whose surface 12 has been subjected to logical circuit and electrode processing. The thus-ground back is subjected to a chemical cleaning treatment and thereafter the substrate 1 is introduced into a vacuum system.

Next, a base metal film (BLM film: Ball Limiting Metallization) 14 of Cr/Cu/Au for example is formed on each electrode (external terminal). [FIG. 2(B)]

Figure 2C:
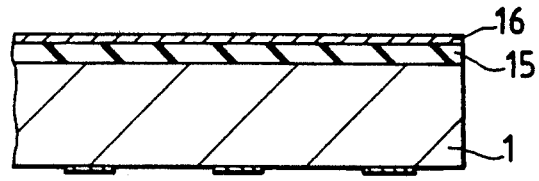

In FIG. 2(C), a barrier metal layer 15 and an oxidation preventing metal layer 16 are formed successively by vacuum evaporation or sputtering on the back 13 of the wafer which has been turned upside down. The barrier metal layer 15 is formed by a metal superior in wettability for solder and capable of serving as a solder/Si diffusion barrier, e.g., Ni, Pd or Pt. In this embodiment, the metal of the barrier metal layer 15 is a metal capable of forming a silicide with Si at a low temperature. The oxidation preventing metal layer 16 is for preventing the oxidation of the surface of the barrier metal layer 15 and it is formed using, for example, Au, Ag, or Pt.

Figure 2D:
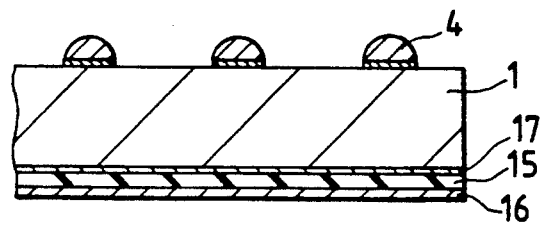

Next, as shown in FIG. 2(D), bump electrodes 4 and a metal silicide layer 17 are formed. After processing the back of the wafer, the wafer is again turned upside down and solder is fed onto the base metal film 14 by a lift-off process, followed by wet back of the solder in an atmosphere held at about 350° C. to form spherical bump electrodes 4. The metal silicide layer 17 is also formed by this wet back process. More particularly, the metal silicide layer 17 is formed at a low temperature by a solid phase reaction of Si of the semiconductor substrate 1 and the metal of the barrier metal layer 15 which reaction is induced by the heat in the wet back process. The temperature required for the formation of the metal silicide layer 17 differs, depending on the metal used, but in this embodiment, in the case of Ni and Pt, these metals are converted into $Ni_2Si$ and $Pt_2Si$, respectively, at a temperature of not lower than 200° C., and in the case of Pd, this metal is converted into $Pd_2Si$ at a temperature of not lower than 100° C. Further, the metal silicide layer 17 is formed in the depth direction while maintaining uniformity in the lateral direction. For example, in the case of a single crystal Si-Ni system, the relation between the film thickness (l) and time (t) of $Ni_2Si$ formed at 200°–350° C. follows the diffusion rate determining rule of $l \propto t^{\frac{1}{2}}$. The thicknesses of the metallized films are 1,000–10,000ÅNi, 1,000–5,000ÅAu and 500–2,000Å$Ni_2Si$.

The wafer which has gone through the bump electrode 4 processing and the substrate back processing then goes through a dicing process, whereby it is made into individual semiconductor chips.

Figure 2E:
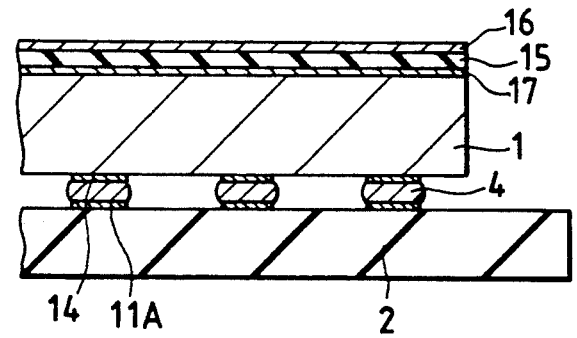

As shown in FIG. 2(E), each semiconductor chip 1 is connected and mounted mechanically and electrically by face down bonding onto a mounting substrate 2 with wiring and electrodes 11A formed thereon. More specifically, the bump electrodes 4 of the semiconductor chip 1 are positioned and aligned onto the electrodes 11A on the mounting substrate 2, followed by heating to about 340°–350° C. using suitable heating means, e.g., a heating furnace, whereby the bumps 4 made of Pb-Sn solder are melted and rendered integrally with the electrodes 11A, and in this way the chip 1 is mounted on the mounting substrate 2 (a mounting and reflow process). As a result, the wiring on the mounting substrate 2 and the logical circuits formed on the main surface of the semiconductor chip 1 are connected together for input and output through the bump electrodes 4.

On the other hand, since this process is carried out at a temperature approximately equal to the temperature in the wet back process, the metal of the barrier metal layer 15 forms a silicide. Thus, the metal silicide layer 17 formed in the wet back process is further subjected to the heat treatment in the mounting and reflow process, whereby the thickness of the metal silicide layer 17 can be made into a thickness necessary for attaining a close adhesion.

Figure 2F:
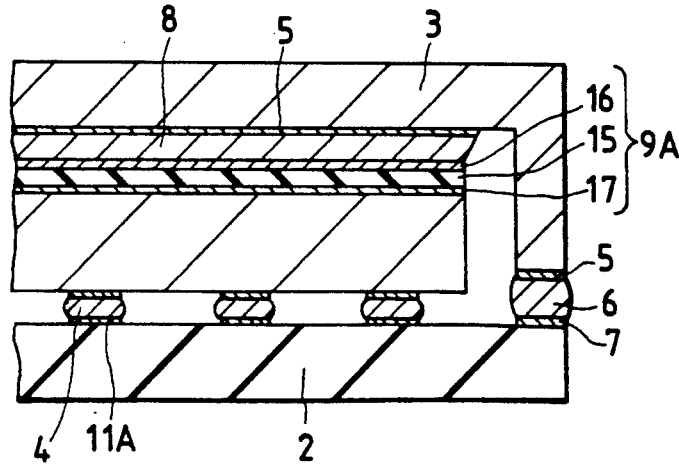

After the formation of the metallized layer 9A on the back surface of the semiconductor chip 1 and the mounting of the chip onto the mounting substrate 2 in the processes of FIGS. 2(A) to (E), the chip is sealed with a cap 3 as shown in FIG. 2(F).

More specifically, first a adhering member 6, e.g., solder of 10 wt % of Sn-Pb or 2.5 wt % of Ag-Pb, is placed on a metallized layer formed as a cap 3 bonding area on the peripheral portion of the mounting substrate 2, while on the metallized layer 9A formed on the back of the semiconductor chip 1 is placed solder of, for example, 10 wt % of Sn-Pb or 2.5 wt % of Ag-Pb, serving as a heat transmitting layer 10, and then the U-shaped cap 3 is mounted so as to enclose the chip 1 therein. Between the bonding region of the sealing cap 3 and the adhering member 6 and also between the cap 3 and the heat transmitting layer 10, there is formed a bonding metallized layer 5 of Ti/Ni/Au, for example. Thereafter, a heat treatment (300°–310° C.) is performed under a predetermined load until melting of both the adhering member 6 and the heat transmitting layer 10.

When the above heat treatment is over, there is completed a semiconductor device with the semiconductor chip 1 sealed in the interior of the cavity defined by both the mounting substrate 2 and the sealing cap 3, as shown in FIGS. 1 and 2(F).

Thus, in the semiconductor device wherein the semiconductor chip 1 is mounted on the chip mounting surface of the mounting substrate 2 by a face down bonding method and is sealed hermetically within the cavity defined by both the substrate 2 and the sealing cap 3, there is formed, in the bonding portion of the back of the semiconductor chip 1, the metallized layer 9A comprising the metal silicide layer 17 formed at a low temperature, the barrier metal layer 15 formed of a material capable of preventing the diffusion of solder/Si and the surface oxidation preventing metal layer 16, and the chip 1 is fixed to the sealing cap 3 through a solder 8. With this construction, it is possible to improve the close adhesion between the back surface 13 of the semiconductor chip and the cap 3 and also improve the heat radiation efficiency.

Moreover, since the barrier metal layer 15 is formed using a metal difficult to be diffused to the surface oxidation preventing metal layer 16, it is possible to make this layer thin. Consequently, not only the wettability for solder can be improved but also it is possible to diminish the formation of a hard Au-Sn alloy layer due to the reaction of the metal layer 16 and Au remaining in the solder 8 after reflow so that fracture caused by stress concentration, namely, deterioration in mechanical characteristics of the solder, can be diminished, and hence the material cost can be reduced.

Further, since the metal silicide layer 17 in the metallized layer 9A formed on the back of the semiconductor substrate 1 according to this embodiment can be formed by the heat treatment in the wet back process [FIG. 2(D)] for forming the bump electrodes 4, or by the heat treatment in the mounting and reflow process [FIG. 2(E)] for mounting the semiconductor chip 1 onto the mounting substrate 2, the assembling process interval can be shortened.

[Embodiment]

Figure 3A:
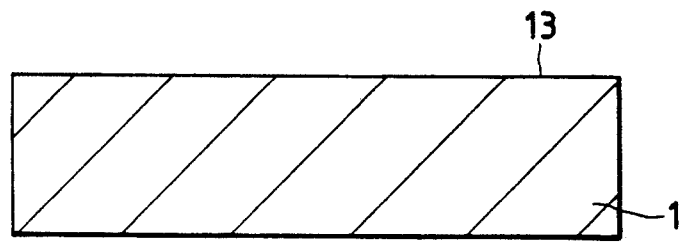
FIGS. 3(A) to 3(C) are sectional views of main processes, showing a metallization structure according to another embodiment II of the present invention as well as how to fabricate it.
Figure 3B:
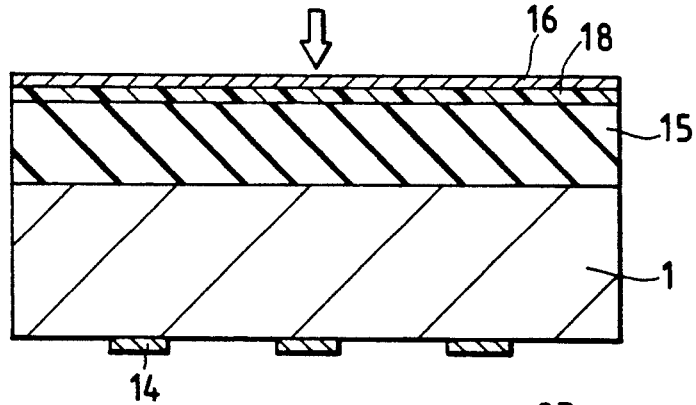
Figure 3C:
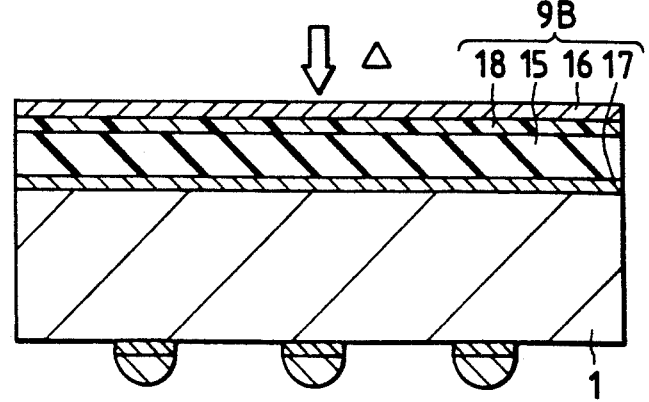

Referring now to FIGS. 3(A) to (C), there is illustrated a method for forming another metallization structure according to the invention on the back of a semiconductor substrate.

In FIG. 3(C), a metallized layer 9B formed on a back surface 13 of a semiconductor substrate 1 includes a mixed metal layer 18 formed between a barrier metal layer 15 and an oxidation preventing metal layer 16, the mixed metal layer 18 comprising a mixture of the constituent metals of both layers 15 and 16.

After completion of the formation of electrodes on a surface 12 of the semiconductor substrate 1 and processing of the back 13 in FIG. 3(A) like the embodiment I, a barrier metal layer 15 of, for example, Ni, Pd or Pt, a mixed metal layer 18 and an oxidation preventing metal layer of, for example, Au, Ag or Pt are formed successively from the back 13 side of the semiconductor substrate 1 by vapor deposition or sputtering, as shown in FIG. 3(B). The mixed metal layer 18 is formed by simultaneous vapor deposition of the metal of the barrier metal layer 15 and the metal of the oxidation preventing metal layer 16 or by sputtering using an alloy target consisting of both metals. The thickness of the mixed metal layer 18 is, say, 1,000Å to 5,000Å.

Next, as shown in FIG. 3(C), a metal silicide layer 17 is formed between the back surface of said semiconductor substrate 1 and the barrier metal layer 15. Like the embodiment I, the metal silicide layer 17 is formed by the heat treatment of about 350° C. in the wet back process for forming bump electrodes or in the mounting and reflow process for mounting the semiconductor chip 1.

The metallization structure using the mixed metal layer 18 in this embodiment II is effective in the case where a heat transmitting layer 10 for connection between the semiconductor chip 1 and the sealing cap 3 is formed of solder not containing Sn, e.g., Pb-Ag solder. That is, since Sn which contributes to an intermetallic compound forming reaction with the barrier metal layer 15 at the time of bonding is not contained, the oxidation preventing metal layer 16 as the top layer contributes to the bonding. Therefore, the mixed metal layer 18 functions as an intermediate medium layer after the oxidation preventing metal layer 16 has been consumed in the bonding.

[Modification I]

Other methods for fabricating the metallization structures of the embodiments I and II each formed on the back of the semiconductor substrate will be described below with reference to FIGS. 4(A) to (E).

According to these methods, a metal silicide layer 17 is formed within a chamber by utilizing the substrate heating which is performed at the time of forming the barrier metal layer 15.

First in FIG. 4(A), electrodes are formed on the surface 12 of the semiconductor substrate 1 and the back 13 of the substrate is processed, in the same manner as in the embodiment I. Thereafter, in FIG. 4(B), the substrate heating temperature is set to a level not lower than the silicide forming temperature, for example, not lower than 200° C. in the case of Ni and Pt, or not lower than 100° C. in the case of Pd, and a metal which will later form a barrier metal layer is formed by vapor deposition or sputtering and at the same the silicidation is performed. Thus, unlike the embodiments I and II, the metal silicide layer 17 is formed prior to the formation of the barrier metal layer.

After the formation of the metal silicide layer 17, the substrate heating temperature is set to a level below the silicide forming temperatures of the constituent metals. Then, such a barrier metal layer 15 as shown in FIG. 4(C), having a predetermined thickness (e.g., 1,000-10,000Å), is formed on the previously-formed metal silicide layer 17 by vapor deposition or sputtering.

After the formation of the barrier metal layer 15, a metal such as Au, Ag and Pt, is vapor-deposited on the surface of the barrier metal layer, as shown in FIG. 4(D), to form a metallized layer 9A having the same structure as that in the embodiment I, that is, the structure consisting of the metal silicide layer 17, barrier metal layer 15 and oxidation preventing metal layer 16.

On the other hand, if after the formation of the barrier metal layer 15 a mixed metal layer 18 consisting of the metal of the barrier metal layer and an oxidation preventing metal which will later serve as the top layer, as well as an oxidation preventing metal layer 16, are formed successively on the surface of the barrier metal layer 15, as shown in FIG. 4(E), there is obtained a metallized layer 9B having the same structure as that in the embodiment II, that is, the structure consisting of the metal silicide layer 17, barrier metal layer 15, mixed metal layer 18 and oxidation preventing metal layer 16.

According to this method wherein the metal silicide layer 17 is formed before the formation of the barrier metal layer 15, the control of the silicidation becomes easier. Besides, since the thickness of the metal silicide layer 17 can be made optimum, it is possible to provide a chip carrier of high reliability.

Further, this method may be applied to the manufacture of a semiconductor device not requiring such a heating process as the wet back process or the mounting and reflow process.

[Modification II]

Still other methods for fabricating the metallization structures of the embodiments I and II each formed on the back of the semiconductor substrate will be described below with reference to FIGS. 5(A) to (E).

Figure 5A:
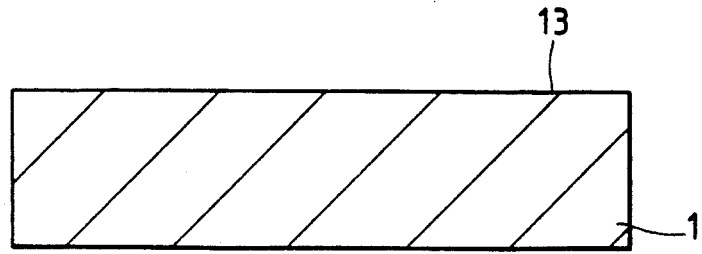
FIGS. 5(A) to 5(E) are sectional views of main processes, showing fabrication methods for the metallization structures of the embodiments I and II, using as the barrier metal a metal which forms a silicide at a relatively high temperature.
Figure 5B:
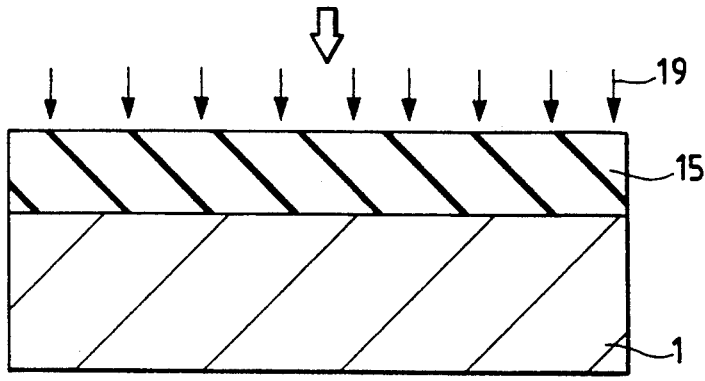
Figure 5C:
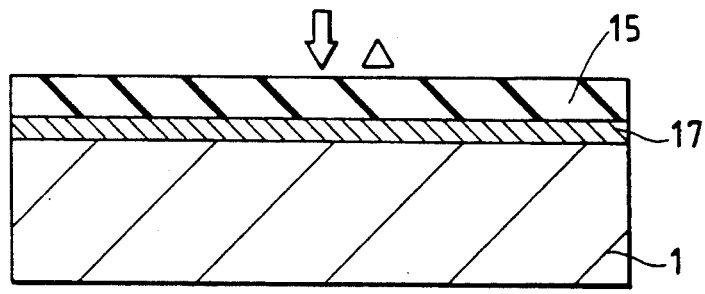

As shown in FIG. 5(A), electrodes (not shown) are formed on the surface 12 of the semiconductor substrate 1 and the back 13 of the substrate is processed in the same manner as in the embodiment I. Thereafter, as shown in FIG. 5(B), a barrier metal layer 15 is formed by vapor deposition or sputtering of a metal relatively high in silicidation temperature, e.g., Fe, Co or Mn, followed by a locally heating surface-layer annealing 19 such as, for example, lamp annealing or laser annealing, for a predetermined period of time, to form a metal silicide layer 17 of a desired thickness (e.g., 500–2,000Å), as shown in FIG. 5(C). The annealing temperature differs, depending on metals, but in the case of Fe, 450° C. or higher causes a conversion to FeSi or FeSi$_2$; in the case of Co, 350° C. or higher causes a conversion to Co$_2$Si, CoSi or CoSi$_2$; and in the case of Mn, 400° C. or higher causes a conversion to MnSi$_2$.

Figure 5D:
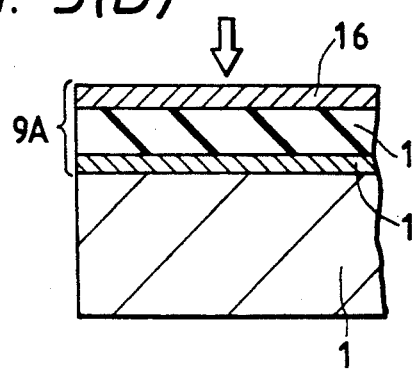

After the formation of the barrier metal layer 15 and the metal silicide layer 17, by vapor-depositing a metal, e.g., Au, Ag or Pt, on the surface of the barrier metal layer 15, as shown in FIG. 5(D), there is formed a metallized layer 9A having the same structure as that in the embodiment I, that is, the structure consisting of the metal silicide layer 17, barrier metal layer 15 and oxidation preventing metal layer 16.

Figure 5E:
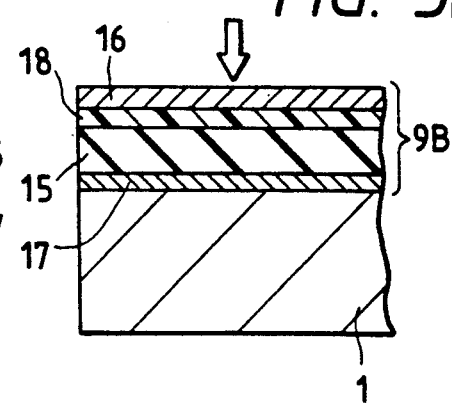

On the other hand, if after the formation of the barrier metal layer 15 and the metal silicide layer 17 a mixed metal layer 18 consisting of the metal of the barrier metal layer 15 and an oxidation preventing metal which will later serve as the top layer, as well as an oxidation preventing metal layer 16, are formed successively on the surface of the barrier metal layer 15, as shown in FIG. 5(E), there is obtained a metallized layer 9B having the same structure as that in the embodiment II, that is, the structure consisting of the metal silicide layer 17, barrier metal layer 15, mixed metal layer 18 and oxidation preventing metal layer 16.

According to this method wherein the metal silicide layer 17 is formed by the surface-layer annealing 19, there can be used a metal (e.g., Fe, Co or Mn) which is relatively high in silicidation temperature, as the barrier metal layer, so it is possible to improve the heat resistance of the barrier metal layer 15 in the subsequent assembling process, for example in the form of a glass sealed type semiconductor package.

[Modification III]

Still other methods for fabricating the metallization structures of the embodiments I and II each formed on the back of the semiconductor substrate will be described below with reference to FIGS. 6(A) to (E).

In FIG. 6(A), first a mechanical or chemical processing is applied to a back surface 13 of a semiconductor substrate 1 which is in the form of a wafer. Then, as shown in FIG. 6(B), an unsilicidated metal layer 20 which will later form a silicide layer is formed on the back 13 by vapor deposition or sputtering. The metal layer 20 is formed using a metal high in silicide forming temperature (about 500° C. or higher), e.g., W, Mo or Ta. Thereafter, the semiconductor substrate 1 is introduced into a wafer process for forming logical circuits or electrodes on the surface thereof, indicated at 12. In the wafer process, a surface process is applied to the substrate 1 by a diffusion process for forming source and drain and a wiring process for electrically interconnecting elements formed on a main surface of the semiconductor substrate 1. In these diffusion process and wiring process, there is made heating to about 800°–1,200° C. and about 400°–475° C., respectively. Therefore, as shown in FIG. 6(C), the unsilicidated metal layer 20 formed on the back 13 of the semiconductor substrate 1 is silicidated in the diffusion process and forms a metal silicide layer 17. W and Ta form WSi$_2$ and TaSi$_2$, respectively, at a temperature of not lower than 650° C., while Mo forms MoSi$_2$ at a temperature of not lower than 525° C.

Thus, the metal silicide layer 17 is formed in the initial stage of the wafer process, while the back 13 of the semiconductor substrate 1 with the metal silicide layer 17 formed thereon is contaminated variously in the subsequent wafer process. To prevent this, the wafer process is followed by etch back of the back surface 13 to expose a clean surface.

As shown in FIG. 6(D), a metallized layer 9A having the same structure as that in the embodiment I is obtained by successively forming a barrier metal layer 15 of, for example, W, Ta or Mo and an oxidation preventing metal layer 16 of, for example, Au, Ag or Pt.

On the other hand, as shown in FIG. 6(E), a metal silicide layer 9B having the same structure as in the embodiment II is obtained by forming a mixed metal layer 18 of, say, W, Ta, or Mo, and Au, Ag, or Pt, between the barrier metal layer 15 and the oxidation preventing metal layer 16.

Although this method has been described mainly with respect to the case where Pb-Sn solder is used as the heat-transmitting layer, in the case where such Pb-Sn solder is not used, that is, in the case of using as the heat transmitting layer Sn-Ag solder (e.g., 96.5 wt % of Sn and 3.5 wt % of Ag), Pb-Ag solder (e.g., 97.5 wt % of Pb and 2.5 wt % of Ag), or Au-Sn solder (e.g., 80 wt % of Au and 20 wt % of Sn), the barrier metal layer 15 is not needed because the oxidation preventing metal layer 16 is used as a bonding layer. That is, a metallized layer consisting of the metal silicide layer 17 and oxidation preventing metal layer 16 or consisting of the metal silicide layer 17, mixed metal layer 18 and oxidation preventing metal layer 16 is formed on the back 13 of the semiconductor substrate 1.

Since bonding is performed using a metal high in silicidation temperature (namely, stable to heat), it is possible to provide a semiconductor chip applicable to various packaging methods.

Although the present invention has been described above on the basis of embodiments thereof, it goes without saying that the invention is not limited to those embodiments and that various changes may be made within the scope not departing from the gist of the invention.

For example, when a ferromagnetic metal, e.g., Ni, is used as the barrier metal layer 15 and in the case where a sputtering method is adopted, the film quality may be deteriorated due to a decrease in deposition rate. Therefore, there may be used Ni containing Cu (for example, containing 28 at. % of Cu) as the target. In this case, the metallized layer formed on the back of the semiconductor substrate 1 comprises a metal silicide layer ($Ni_2Si$), a barrier metal layer (1,000–5,000Å) of Ni-Cu (28 at. %) and an oxidation preventing metal layer (1,000–3,000Å) of Au.

What is claimed is:

1. A method for manufacturing a semiconductor device comprising the steps of:
   (a) providing a first substrate of silicon having a main surface with circuits and plural electrodes formed thereon and also having a back surface on an opposite side;
   (b) forming on the back surface a first metallic layer comprising a barrier metal and an oxidation preventing metal;
   (c) forming simultaneously bump electrodes on the electrodes and a second metallic layer of a metal silicide between said back surface and the barrier metal; and
   (d) fixing a second substrate into close contact with the back surface of the first substrate through an adhesive layer.

2. A method for manufacturing a semiconductor device according to claim 1, wherein the bump electrodes and the metal silicide layer are formed in an atmosphere at a temperature of not higher than 350° C.

3. A method for manufacturing a semiconductor device according to claim 1, wherein the adhesive layer is formed of solder.

4. A method for manufacturing a semiconductor device according to claim 1, wherein the metal silicide is one of $Ni_2Si$, $Pt_2Si$ and $Pd_2Si$.

5. A method for manufacturing a semiconductor device according to claim 1, wherein the barrier metal is one of Ni, Pt and Pd.

6. A method for manufacturing a semiconductor device according to claim 1, wherein the oxidation preventing metal is one of Au, Ag and Pt.

7. A method for manufacturing a semiconductor device comprising the steps of:
   (a) providing a semiconductor chip of silicon having a main surface with circuits and plural bump electrodes formed thereon and also having on an opposite side a back surface with a first metallic layer formed thereon, the first metallic layer comprising at least two metals;
   (b) mounting the semiconductor chip onto a substrate having plural electrodes on the main surface thereof in such a manner that the bump electrodes and the electrodes of the substrate are interconnected electrically, and at the same time forming a second metallic layer of a metal silicide between the back surface of the semiconductor chip and the first metallic layer; and
   (c) sealing the semiconductor chip by sealing means through an adhesive layer formed on the back surface of the semiconductor chip.

8. A method for manufacturing a semiconductor device according to claim 7, wherein the mounting of the semiconductor chip and the formation of the metal silicide are performed in an atmosphere at a temperature of not higher than 350° C.

9. A method for manufacturing a semiconductor device according to claim 7, wherein the first metallic layer is formed by laminating a barrier metal and an oxidation preventing metal successively from the back surface side of the semiconductor chip.

10. A method for manufacturing a semiconductor device according to claim 7, wherein the first metallic layer is formed by laminating a metal silicide, a barrier metal and an oxidation preventing metal successively from the back surface side of the semiconductor chip.

11. A method for manufacturing a semiconductor device according to claim 7, wherein the adhesive layer is formed of solder.

12. A method for manufacturing a semiconductor device according to claim 9, wherein the barrier metal is one of Ni, Pt and Pd.

13. A method for manufacturing a semiconductor device according to claim 9, wherein the oxidation preventing metal is one of Au, Ag and Pt.

14. A method for manufacturing a semiconductor device according to claim 10, wherein the metal silicide is one of $Ni_2Si$, $Pt_2Si$ and $Pd_2Si$.

15. A method for manufacturing a semiconductor device according to claim 10, wherein the barrier metal is one of Ni, Pt and Pd.

16. A method for manufacturing a semiconductor device according to claim 10, wherein the oxidation preventing metal is one of Au, Ag and Pt.

* * * * *